US012765376B2

(12) United States Patent
Zhang et al.

(10) Patent No.: US 12,765,376 B2
(45) Date of Patent: Oct. 13, 2026

(54) MEMORY CELL, THREE-DIMENSIONAL MEMORY, AND METHOD OF OPERATING THREE-DIMENSIONAL MEMORY

(71) Applicant: INSTITUTE OF MICROELECTRONICS, CHINESE ACADEMY OF SCIENCES, Beijing (CN)

(72) Inventors: Gang Zhang, Beijing (CN); Chunlong Li, Beijing (CN); Zongliang Huo, Beijing (CN); Tianchun Ye, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 344 days.

(21) Appl. No.: 18/703,924

(22) PCT Filed: Nov. 2, 2021

(86) PCT No.: PCT/CN2021/128164

§ 371 (c)(1),
(2) Date: Apr. 23, 2024

(87) PCT Pub. No.: WO2023/077264

PCT Pub. Date: May 11, 2023

(65) Prior Publication Data

US 2024/0421032 A1 Dec. 19, 2024

(51) Int. Cl.
*H01L 23/373* (2006.01)
*G11C 16/14* (2006.01)
(Continued)

(52) U.S. Cl.
CPC ........... *H10W 40/258* (2026.01); *G11C 16/14* (2013.01); *G11C 16/26* (2013.01); *H10B 41/27* (2023.02);
(Continued)

(58) Field of Classification Search
CPC ... H10W 40/258; H10W 40/10; H10W 40/00; G11C 16/14; G11C 16/26;
(Continued)

(56) References Cited

U.S. PATENT DOCUMENTS

| | | | | |
|---|---|---|---|---|
| 2011/0233722 A1* | 9/2011 | Liang | H01G 4/232 | 257/532 |
| 2012/0171833 A1* | 7/2012 | Zhu | H10D 30/024 | 438/303 |
| 2013/0058163 A1 | 3/2013 | Kito et al. | | |

FOREIGN PATENT DOCUMENTS

| | | |
|---|---|---|
| CN | 103247337 A | 8/2013 |
| CN | 111373535 A | 7/2020 |
| CN | 113169188 A | 7/2021 |

OTHER PUBLICATIONS

International Search Report and Written Opinion for PCT Application No. PCT/CN2021/128164, Dated Jun. 27, 2022, 8 pages including English Translation.

(Continued)

*Primary Examiner* — Leonardo Andujar
(74) *Attorney, Agent, or Firm* — Christopher R. Christenson; Kelly, Holt & Christenson, P.L.L.C.

(57) ABSTRACT

The memory cell includes: an array of channel layers including N channel layers vertically provided on a substrate, a tunneling layer and a memory layer being sequentially provided on an outer side of the channel layers; N thermal conductive cores provided in the N channel layers respectively and penetrating the substrate; and an array of thermocouples including a thermocouple word line layer (Continued)

grown on the substrate and N thermocouple layers on the thermocouple word line layer, the thermocouple layers being connected one-to-one with the thermal conductive cores. A first potential difference is applied between the thermocouple word line layer and the thermocouple layer, and the thermal conductive core connected with the thermocouple layer is heated, so that the channel layer and the memory layer corresponding to the thermal conductive core are maintained at first and second preset temperatures respectively under a thermal insulation effect of the tunneling layer.

13 Claims, 14 Drawing Sheets

(51) Int. Cl.

| | |
|---|---|
| ***G11C 16/26*** | (2006.01) |
| ***H01L 23/34*** | (2006.01) |
| ***H10B 41/27*** | (2023.01) |
| ***H10B 41/35*** | (2023.01) |
| ***H10B 43/27*** | (2023.01) |
| ***H10B 43/35*** | (2023.01) |
| ***H10W 40/10*** | (2026.01) |
| ***H10W 40/25*** | (2026.01) |

(52) U.S. Cl.
CPC ............ *H10B 41/35* (2023.02); *H10B 43/27* (2023.02); *H10B 43/35* (2023.02); *H10W 40/10* (2026.01)

(58) Field of Classification Search
CPC .... G11C 16/0483; G11C 16/04; H10B 41/27; H10B 41/35; H10B 43/27; H10B 43/35
See application file for complete search history.

(56) References Cited

OTHER PUBLICATIONS

International Preliminary Report on Patentability for International Application No. PCT/CN2021/128164, dated May 16, 2024, 10 Pages.

* cited by examiner

MEMORY CELL, THREE-DIMENSIONAL MEMORY, AND METHOD OF OPERATING THREE-DIMENSIONAL MEMORY

CROSS REFERENCE TO RELATED APPLICATION(S)

This application is a Section 371 National Stage Application of International Application No. PCT/CN2021/128164, filed on Nov. 2, 2021, entitled "MEMORY CELL, THREE-DIMENSIONAL MEMORY, AND METHOD OF OPERATING THREE-DIMENSIONAL MEMORY".

TECHNICAL FIELD

The present disclosure relates to a field of three-dimensional memory technology, and in particular, to a memory cell, a three-dimensional memory, and a method of operating a three-dimensional memory.

BACKGROUND

A three-dimensional NAND memory technology is currently a key technology being developed by the country, which may apply the multi-digital memory technology, such as 4-bit/cell or 5-bit/cell. The three-dimensional memory with high data density is a foundation for building big data and cloud memory systems. The multi-digital memory technology for the three-dimensional memory requires a clear reading space (ESUM) between data states. A higher temperature of a channel during a writing operation is beneficial for achieving better ESUM. However, a higher temperature of a memory layer is not conducive to data retention, which may easily lead to failure of data retention.

SUMMARY

The present disclosure provides a memory cell, a three-dimensional memory, and a method of operating a three-dimensional memory.

A first aspect of the present disclosure provides a memory cell. The memory cell includes: an array of channel layers including N channel layers, wherein the N channel layers are vertically provided on a substrate in a first direction, a tunneling layer and a memory layer are sequentially provided on an outer side of the N channel layers, and N is a positive integer: N thermal conductive cores located in the N channel layers respectively and penetrating the substrate; and an array of thermocouples including a thermocouple word line layer grown on the substrate in a negative direction of the first direction and N thermocouple layers located on the thermocouple word line layer, wherein the N thermocouple layers are connected one-to-one with the N thermal conductive cores, wherein a first potential difference is applied between the thermocouple word line layer and at least one of the N thermocouple layers, and the thermal conductive core connected with the at least one of the N thermocouple layers is heated, so that the channel layer corresponding to the thermal conductive core is maintained at a first preset temperature and the memory layer corresponding to the thermal conductive core is maintained at a second preset temperature under a thermal insulation effect of the tunneling layer.

Furthermore, the memory cell is configured to: apply a writing voltage to a gate layer of the memory cell, after a temperature of at least one channel layer in the array of the channel layers is maintained at the first preset temperature and a temperature of the memory layer corresponding to the at least one channel layer is maintained at the second preset temperature, and wherein a drain layer and the substrate are grounded, and the memory cell is driven to perform a writing operation by using the writing voltage.

Furthermore, a heating time length for the first potential difference is negatively correlated with a thermal conductive performance of the N thermal conductive cores.

Furthermore, each of the N thermal conductive cores includes at least one of tungsten, gold, copper, or silicon carbide.

Furthermore, the memory cell further includes a channel insulation layer provided between the channel layer and the thermal conductive core.

Furthermore, the channel insulation layer is used to isolate the channel layer and the thermal conductive core, and the channel insulation layer includes silicon oxide or aluminum oxide.

Furthermore, the tunneling layer includes silicon oxide or silicon nitride.

Furthermore, the memory cell further includes a block layer provided on an outer side of the memory layer.

A second aspect of the present disclosure provides a three-dimensional memory including the memory cell provided in the first aspect of the present disclosure.

A third aspect of the present disclosure provides a method of operating the three-dimensional memory provided in the second aspect of the present disclosure, including: controlling a voltage bias of a substrate, a drain layer, a gate layer, or the thermocouple layer of at least one memory cell in the three-dimensional memory, so as to implement a data writing operation, a data reading operation, and a data erasing operation of the at least one memory cell in the three-dimensional memory.

Furthermore, implementing the data writing operation of the at least one memory cell in the three-dimensional memory includes: applying the first potential difference between the thermocouple word line layer and the at least one of the N thermocouple layers, and performing a heating treatment on the thermal conductive core connected with the at least one of the N thermocouple layers, so that the channel layer corresponding to the thermal conductive core is maintained at the first preset temperature and the memory layer corresponding to the thermal conductive core is maintained at the second preset temperature under the thermal insulation effect of the tunneling layer: grounding the substrate and the drain layer corresponding to the channel layer, and applying a writing voltage to the gate layer, wherein the at least one memory cell in the three-dimensional memory is driven to perform the writing operation by using the writing voltage.

Furthermore, implementing the data reading operation of the at least one memory cell in the three-dimensional memory includes: triggering a data reading program: applying a bias voltage to the drain layer of the three-dimensional memory; grounding the substrate: applying a turn-on voltage to a gate layer of an unselected memory cell, and applying a reading voltage to a gate layer of a selected memory cell; and sensing a voltage and/or a current variation between a drain layer of the selected memory cell and the substrate, so as to read data.

Furthermore, implementing the data erasing operation of the at least one memory cell in the three-dimensional memory includes: triggering a data erasing program: floating or grounding the gate layer; and applying an erasing voltage to the drain layer, wherein the erasing voltage is sufficient to induce a tunneling effect in the three-dimensional memory, so that electrons stored in the three-dimensional memory are attracted to the drain layer.

BRIEF DESCRIPTION OF THE DRAWINGS

In order to have a more complete understanding of the present disclosure and its advantages, the following description combined with the accompanying drawings are referred to, and in the drawings.

DETAILED DESCRIPTION OF EMBODIMENTS

Figure 1:
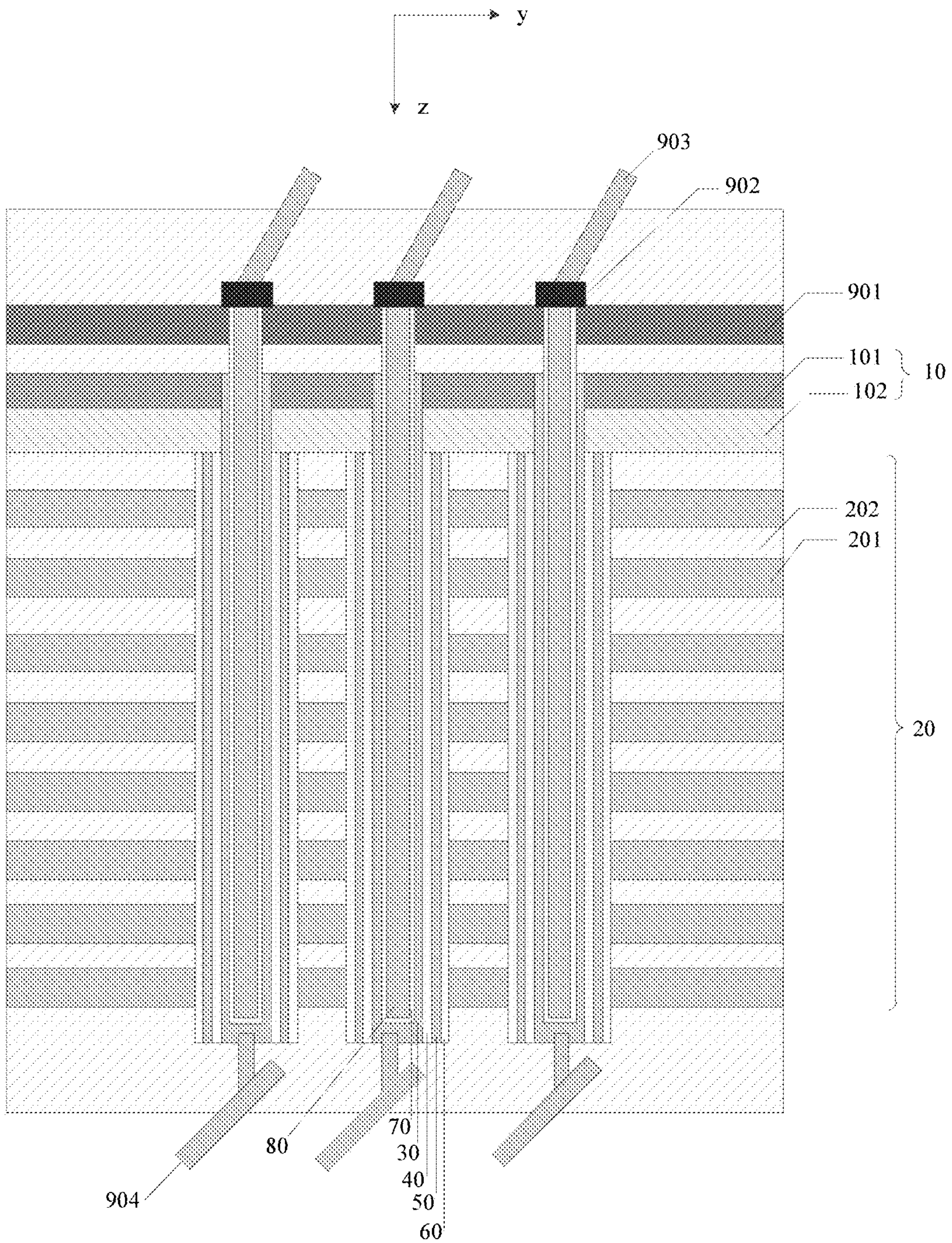
FIG. 1 schematically shows a structural schematic diagram of a part of a cross-section of a memory cell according to an embodiment of the present disclosure.

Hereinafter, embodiments of the present disclosure will be described with reference to accompanying drawings. However, it should be understood that these descriptions are illustrative and not intended to limit the scope of the present disclosure. In the following detailed description, for ease of explanation, many specific details are elaborated to provide a comprehensive understanding of embodiments of the present disclosure. However, it is clear that one or more embodiments may also be implemented without these specific details. Further, in the following, descriptions for known structures and technologies are omitted to avoid obscuring the concept of the present disclosure unnecessarily.

It should be understood that when an element (such as a layer, film, region, or substrate) is described as being "on" a further element, the element may be directly on the further element, or there may also be an intermediate element. Moreover, in the specification and claims, when an element is described as "connected" to a further element, the element may be "directly connected" to the further element, or "connected" to the further element through a third element.

When elaborating on embodiments of the present disclosure, for ease of explanation, the cross-sectional view representing the device structure may not be partially enlarged according to a general scale. Furthermore, the schematic diagram is only an example, which should not limit the scope of protection of the present disclosure. In addition, three-dimensional spatial dimensions of length, width, and depth should be included in actual production.

An embodiment of the present disclosure provides a memory cell. The memory cell includes: an array of channel layers, where the array of channel layers includes N channel layers, the N channel layers are vertically provided on a substrate in a first direction, a tunneling layer and a memory layer are sequentially provided on an outer side of the N channel layers, and N is a positive integer: N thermal conductive cores located in the N channel layers respectively and penetrating the substrate; and an array of thermocouples including a thermocouple word line layer grown on the substrate in a negative direction of the first direction and N thermocouple layers located on the thermocouple word line layer, where the N thermocouple layers are connected one-to-one with the N thermal conductive cores. A first potential difference is applied between the thermocouple word line layer and at least one of the N thermocouple layers, and the thermal conductive core connected with the at least one of the N thermocouple layers is heated, so that the channel layer corresponding to the thermal conductive core is maintained at a first preset temperature and the memory layer is maintained at a second preset temperature under a thermal insulation effect of the tunneling layer.

The memory cell provided in embodiments of the present disclosure is provided with a thermal conductive core inside the channel, and an end of each thermal conductive core is connected to a thermocouple. The thermocouples may generate thermal pulses in units of a string or string group to heat the thermal conductive cores, achieving the purpose of forming a temperature gradient between the channel layer, the memory layer, and the block layer. Good data memory is achieved while ensuring good writing performance.

The following will provide a detailed explanation on the technical solution of the present disclosure, in combination with a structure of a three-dimensional memory in a specific embodiment of the present disclosure. It should be understood that the material layers, shapes, and structures of various parts in the structure of the three-dimensional memory shown in FIG. 1 are only illustrative to assist those skilled in the art in understanding the technical solution of the present disclosure, and are not intended to limit the scope of protection of the present disclosure.

A memory cell is provided in the first exemplary embodiment of the present disclosure.

FIG. 1 schematically shows a structural schematic diagram of a part of a cross-section of a memory cell according to an embodiment of the present disclosure.

As shown in FIG. 1, a structure of the memory cell in an embodiment of the present disclosure includes: a substrate 10; a stack of layers 20 stacked on the substrate 10 in a first direction (a positive direction of z axis): an array of channel layers including N channel layers 30, where the N channel layers 30 are vertically provided on the substrate 10 in a first direction, a tunneling layer 40 and a memory layer 50 are sequentially provided on an outer side of the N channel layers 30, and N is a positive integer: N thermal conductive cores 80 located in the N channel layers 30 respectively and penetrating the substrate 10: an array of thermocouples including a thermocouple word line layer 901 grown on the substrate 10 in a negative direction of the first direction (a negative direction of z-axis) and N thermocouple layers 902 located on the thermocouple word line layer, where the N thermocouple layers 902 are connected one-to-one with the N thermal conductive cores 80.

A first potential difference is applied between the thermocouple word line layer 901 and at least one of the N thermocouple layers 902, and the thermal conductive core 80 connected with the at least one of the N thermocouple layers is heated, so that the channel layer 30 corresponding to the thermal conductive core 80 is maintained at a first preset temperature and the memory layer 50 corresponding to the thermal conductive core 80 is maintained at a second preset temperature under a thermal insulation effect of the tunneling layer 40.

In an embodiment of the present disclosure, the substrate 10 may be a conductivity type substrate 10, including: a first conductivity type substrate 101 and a second conductivity type substrate 102. Materials of the first conductivity type substrate 101 and the second conductivity type substrate 102 may be polycrystalline silicon with opposite conductivity types.

Specifically, the first conductivity type is p-type, and the second conductivity type is n-type. Correspondingly, the first conductivity type substrate 101 is a p-type substrate, and the second conductivity type substrate 102 is an n-type conductive layer. The p-type substrate is used to provide holes required for the erasing operation, and the holes provided by the first conductivity type substrate 101 are pumped into the channel layer 30 to achieve the erasing operation. The n-type conductive layer provides electrons required for the reading operation, and the electrons provided by the second conductivity type conductive layer 102 (the n-type conductive layer) are pumped into the channel layer 30 to achieve the reading operation.

According to an embodiment of the present disclosure, the stack of layers 20 includes a plurality pairs of stacked layers. Each pair of stacked layers includes a first stack material 201 and a second stack material 202. The second stack material 202 and the first stack material 201 are sequentially stacked on the substrate 10. In an example, the second stack material 202 is an insulation layer, such as OX, etc. The first stack material 201 is a metal dielectric layer, which is a word line layer. A word line layer in the stack of layers 20 closest to the substrate 10 is a lower selection layer, and a word line layer in the stack of layers 20 farthest from the substrate 10 is an upper selection layer. Specifically, an array of channel holes is formed by etching the stack of layers 20.

In an embodiment of the present disclosure, a block layer 60, a memory layer 50, a tunneling layer 40, and a channel layer 30 are sequentially grown in the array of channel holes formed by etching the stack of layers 20. A part of the block layer 60, the memory layer 50, and the tunneling layer 40 are removed to expose a part of the channel layer 30, as shown in FIG. 1. A channel insulation layer 70 is provided between the channel layer 30 and the thermal conductive core 80.

Specifically, the tunneling layer 40 is a thermal insulation layer used to prevent the temperature of the memory layer 50 from suddenly rising with the temperature of the thermal conductive core 80. A material of the tunneling layer 40 may be silicon oxide or silicon nitride, etc. The channel insulation layer 70 is a thin electrical insulation layer used to isolate the channel layer 30 and the thermal conductive core 80. A material of the channel insulation layer 70 may be silicon oxide or aluminum oxide, etc.

In an embodiment of the present disclosure, the thermocouple word line 901 is a small-sized metal line. A line width of the thermocouple word line 901 is less than a width of the channel hole. The line width of the thermocouple word line 901 is about 100 nm. As shown in FIG. 1, the thermocouple word line 901 is in the same direction as the word line layer 201 in the y-axis direction. Each thermocouple word line 901 covers one string in the x-axis direction. The word line layer 201 is a large-sized metal line that covers a plurality of strings in the x-axis direction, such as 9 strings, 16 strings, 19 strings, 24 strings, etc. The line width of the word line layer 201 may be 1600 nm or 3200 nm, etc. It should be noted that in this embodiment, as shown in FIG. 1, the width of the channel hole is a distance between block layers 60 on both sides of each channel hole.

As shown in FIG. 1, a thermal conductive core 80 is provided in each channel layer 30. Each thermal conductive core 80 penetrates the substrate 10 and the thermocouple word line layer 901 to be connected to the thermocouple layer 902. The thermocouple layer 902 and the thermocouple bit line 903 of the memory cell are connected one-to-one in correspondence, or the thermocouple layer 902 corresponds one-to-one with the bit line 904 (8-bit-line or 16-bit-line) in the group of bit lines. In an embodiment of the present disclosure, the thermal conductive core 80 is a good conductor of temperature. A material of the thermal conductive core 80 may be a metal or semiconductor, such as tungsten, gold, copper, silicon carbide, etc.

Specifically, in order to raise the temperatures of the channel layer 30 and the memory layer 50 to the preset temperatures, the thermal conductive core 80 connected to the thermocouple layer 902 is heated through the thermocouple layer 902. The heating time length for the thermal conductive core 80 is negatively correlated with the thermal conductive performance of the thermal conductive core 80. That is, the better the thermal conductive performance of the thermal conductive core 80, the shorter the heating time length. For example, if the material of the thermal conductive core 80 is copper or gold with good thermal conductivity, the heating time length is in a range of 1 ms to 5 ms. If the material of the thermal conductive core 80 is a material with poor thermal conductivity, the heating time length is in a range of 6 ms to 10 ms. It should be noted that, in order to ensure a high-speed writing rate for the memory, the preferred heating time is in milliseconds, so as to quickly heat the thermal conductive core 80 to perform the writing operation.

According to an embodiment of the present disclosure, before performing a writing operation on the memory cell, a first potential difference is applied between the thermocouple word line layer 901 and at least one of the N thermocouple layers 902, and the thermal conductive core 80 connected with the at least one of the N thermocouple layers 902 is heated, so that the channel layer 30 corresponding to the thermal conductive core is maintained at a first preset temperature and the memory layer 50 corresponding to the thermal conductive core is maintained at a second preset temperature under a thermal insulation effect of the tunneling layer 40.

The selection of the at least one thermocouple layer 902 among N thermocouple layers may be controlled through a logic control circuit. A bias voltage operation may be performed on the thermocouple layers connected with the selected string or string groups to raise the temperature of the thermocouple to a temperature below 450° C. The thermal conductive core 80 conducts the temperature of the thermocouple to the selected string or string group, so as to raise the temperatures of the channel layer and the memory layer to the preset temperatures. According to the difference in ambient temperature, the number of thermal pulses of the bias voltage is a variable. The number of thermal pulses applied at a higher ambient temperature is less than the number of thermal pulses applied at a lower ambient temperature. When the temperatures of the channel layer and the memory layer are raised to the preset temperatures, the thermal pulses stop.

Figure 2:
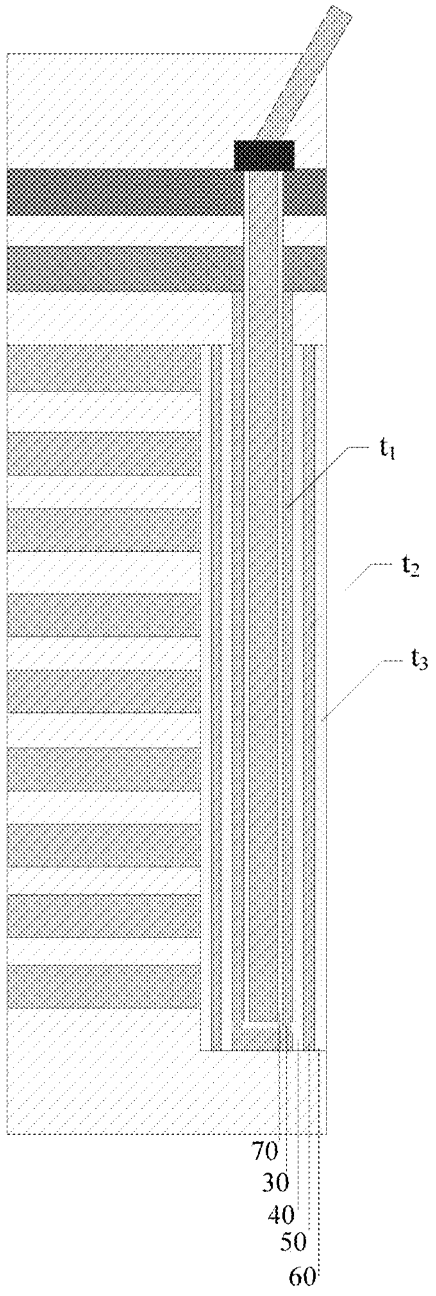
FIG. 2 schematically shows a schematic diagram of a temperature gradient of the memory cell shown in FIG. 1.

Specifically, the first potential difference may be in a range of 8 V to 10 V, and the heating time length is in a range of 1 ms to 10 ms. Under such voltage bias and heating time length, the temperature of the heated thermal conductive core 80 may be quickly raised to near the temperature of the thermocouple layer (less than 450° C.), thereby maintaining the temperature of the channel layer 30 at the first preset temperature $t_1$ in a range of 65° C. to 90° C., maintaining the temperature of the memory layer 50 at the second preset temperature $t_2$ in a range of 30° C. to 40° C., and maintaining the temperature of the block layer 60 at the natural ambient temperature $t_3$ in a range of −25° C. to 30° C., as shown in FIG. 2. By forming a temperature gradient between the channel layer 30, the memory layer 50, and the block layer 60, the memory cell may achieve good data memory while ensuring good writing, therefore effectively avoiding the problem of the temperature of the memory layer being unfavorable for data storage when performing the writing operation at the higher temperature.

In the memory cell provided by the present disclosure, the selected thermal conductive core is heated through the array of thermocouples, and the temperature gradient is formed between the channel layer, the memory layer, and the block layer, so that when performing the writing operation for the memory cell, the memory cell is at a constant temperature without being affected by an ambient temperature variation. In addition, while ensuring a good writing temperature for the memory cell, a good data memory temperature is also achieved.

It should be noted that, FIG. 1 is only a partial cross-sectional view of the memory cell provided by the present disclosure, and does not represent a limitation to the number of layers of the memory cell and the number of arrays of channel layers provided in the present disclosure. The number of layers of the memory cell and the number of the arrays of channel layers provided in the present disclosure may be set according to actual application situations, and embodiments of the present disclosure are not limited to this.

A method of manufacturing a memory cell is provided in the second exemplary embodiment of the present disclosure.

FIGS. 3A to 3I schematically show structural schematic diagrams corresponding to steps in a method of manufacturing a memory cell according to an embodiment of the present disclosure. The structure of the memory cell fabricated through the steps in the method is shown in FIG. 1.

As shown in FIGS. 3A to 3I, the method of manufacturing the memory cell includes steps 301 to 309.

Figure 3A:
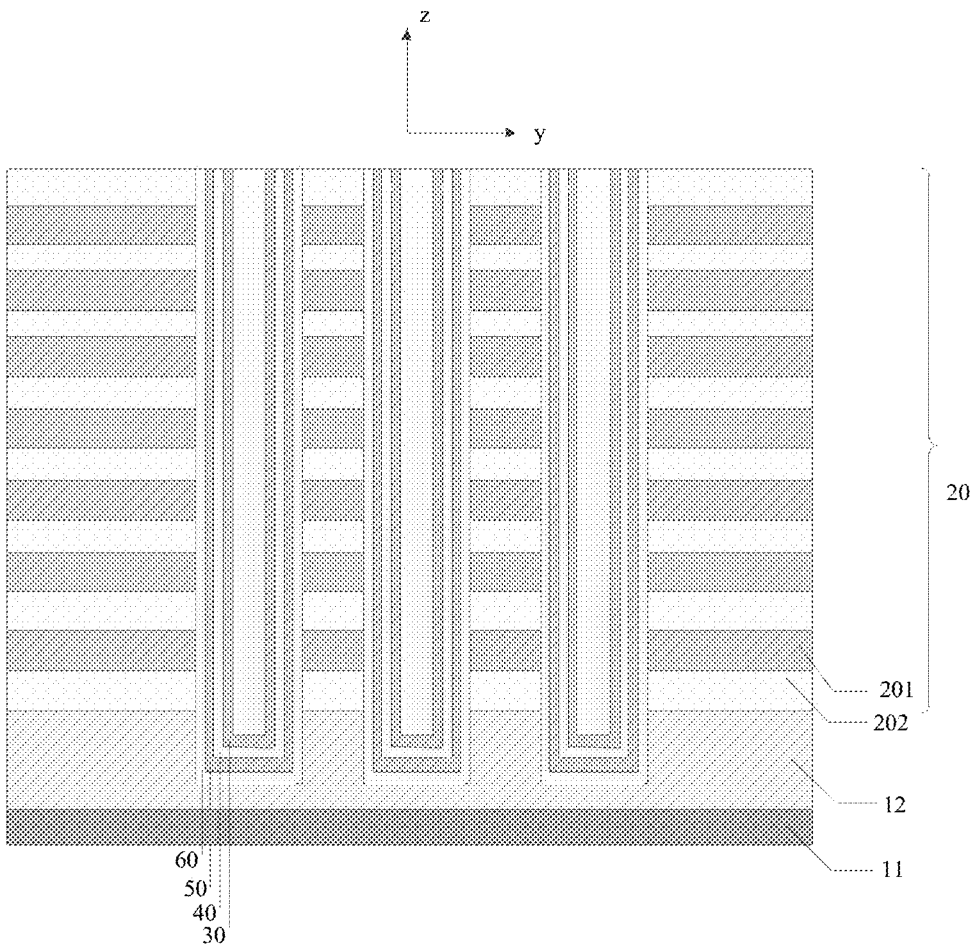
FIGS. 3A to 3I schematically show structural schematic diagrams corresponding to steps in a method of manufacturing a memory cell according to an embodiment of the present disclosure.

In step 301, as shown in FIG. 3A, N channel holes are fabricated in a first low concentration conductivity type extension layer 12 and the stack of layers 20 on a substrate 11; and a block layer 60, a memory layer 50, a tunneling layer 40, and a channel layer 30 are deposited sequentially on inner sides and bottom portions of the N channel holes, and N is a positive integer.

In this embodiment, the first low concentration conductivity type extension layer 12 (p-type silicon extension layer 12) and the stack of layers 20 are sequentially deposited on the substrate (in the positive direction of z-axis). The first low concentration conductivity type extension layer 12 is, for example, a p-type silicon substrate. In the subsequent steps, wet etching may be stopped on the p-type silicon extension layer by using a high selectivity ratio of p-type silicon to p-type silicon.

Figure 3B:
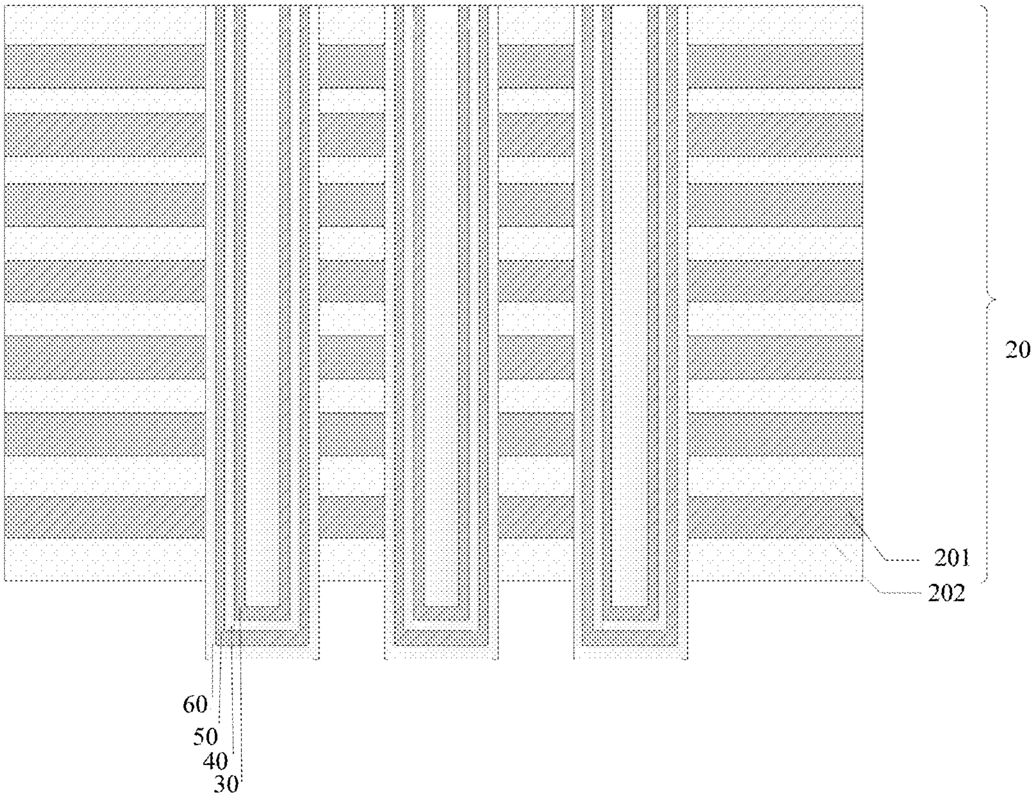

In step 302, as shown in FIG. 3B, the substrate 11 and the first low concentration conductivity type extension layer 12 are removed sequentially, so as to expose a part of the block layer 60.

In this embodiment, the memory cell serves as a part of the three-dimensional memory. The front of the memory cell is closely attached to the front of the logic control unit.

After pasting the memory cell and the logic control unit and removing most of the thickness of the substrate 11 using a chemical mechanical polishing method at the back of the memory cell (on the substrate side), wet etching is performed using the high selectivity ratio of p-type silicon to p-type silicon (whose doping concentrations are different) and stopped on the p-type silicon extension layer 12. The operation of removing the substrate using wet etching in step S302 may be performed only on a side of the substrate 11 of the device, without the need to place the entire device in the corrosive solution.

In this embodiment, the p-type silicon extension layer 12 may be removed by wet etching using the high selectivity ratio of silicon oxide to silicon, so as to expose a part of the block layer 60.

Figure 3C:
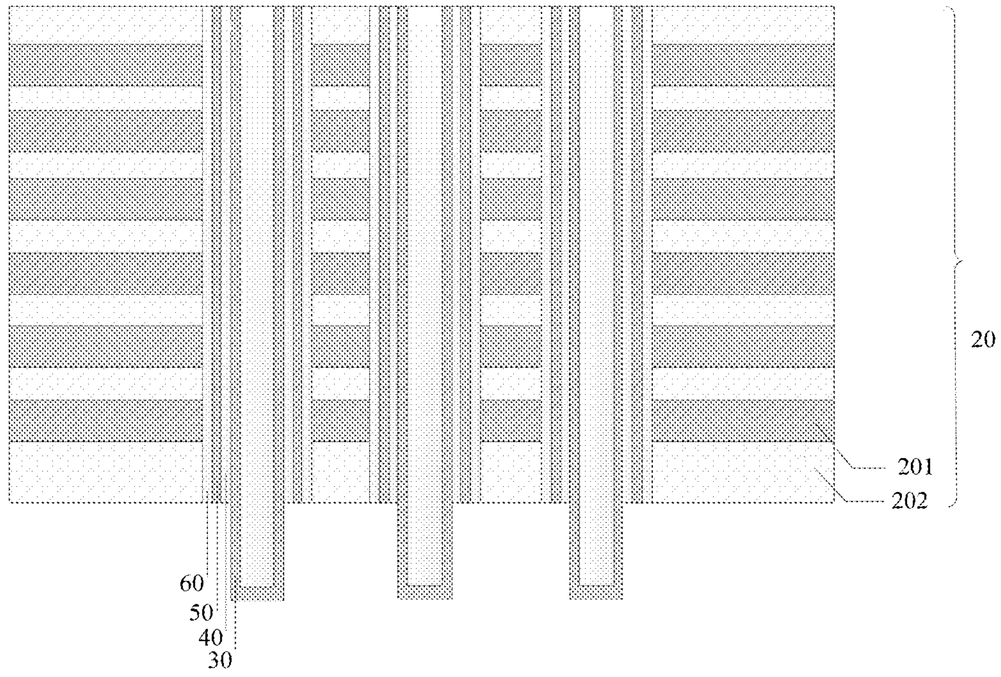

In step 303, as shown in FIG. 3C, a certain height of each of the block layer 60, the memory layer 50, the tunneling layer 40, and the stack of layers 20 is removed, so that a part of the channel layer 30 is exposed.

Figure 3D:
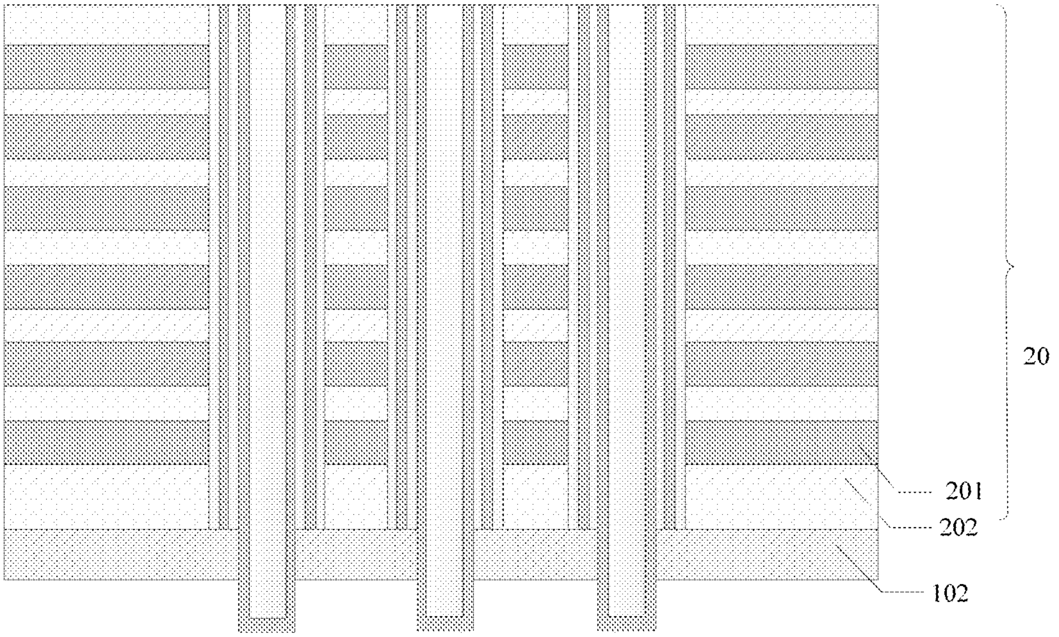

In step 304, as shown in FIG. 3D, a second conductivity type covering layer is deposited on an exposed upper surface of the channel layer 30 (in the negative direction of z-axis), and a part of the second conductivity type covering layer corresponding to a protruding part of the channel layer 30 is removed, so that the second conductivity type covering layer is in a same horizontal plane and exposes the protruding part of the channel layer 30.

In this embodiment, the second conductivity type covering layer is deposited on the exposed upper surface of the channel layer 30. The second conductivity type covering layer may be n-type silicon. The second conductivity type covering layer is the precursor of the corresponding second conductivity type substrate 102 in the subsequent device structure. The second conductivity type substrate 102 is obtained after the patterning process.

As shown in FIG. 3D, the second conductivity type covering layer corresponding to the protruding part of the channel layer 30 is removed, so that the second conductivity type covering layer is in the same horizontal plane and exposes the protruding part of the channel layer 30. The second conductivity type covering layer is patterned to form the second conductivity type substrate 102.

Figure 3E:
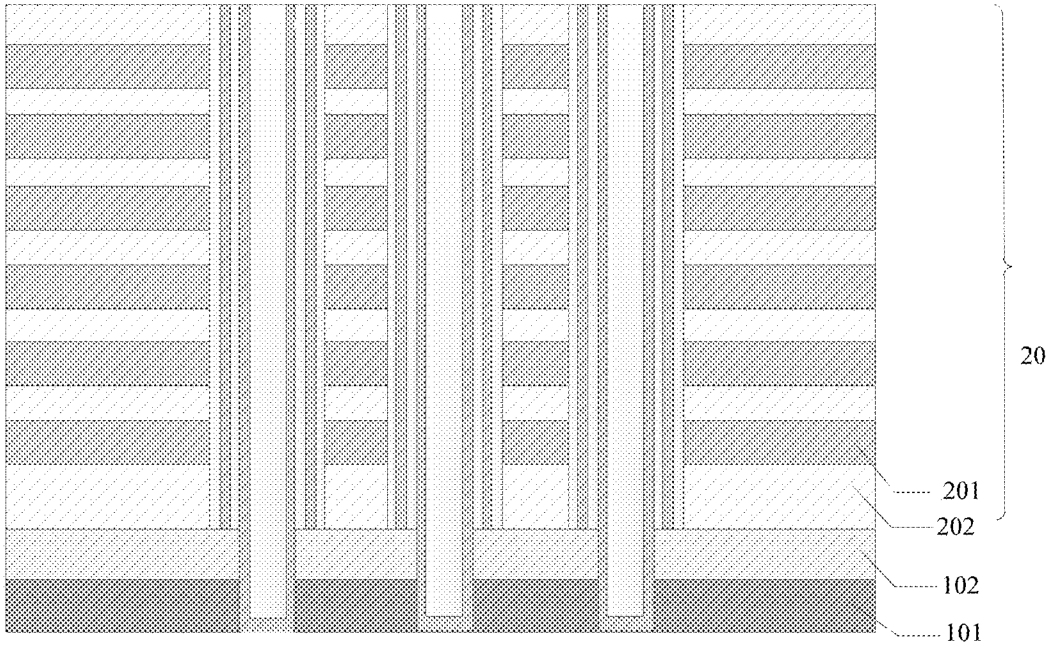

In step 305, as shown in FIG. 3E, the first conductivity type substrate 101 is deposited on the second conductivity type substrate 102. The formed first conductivity type substrate 101 does not cover an upper part of the protruding part of the channel layer 30.

Figure 3F:
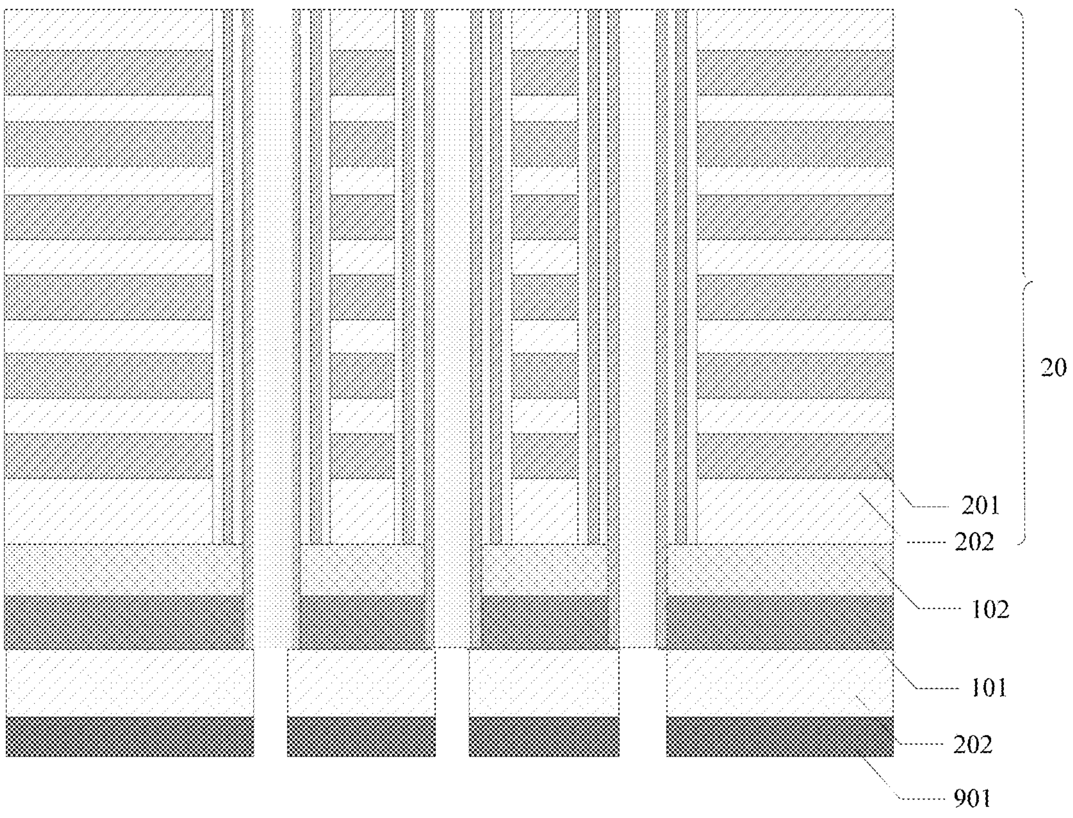

In step 306, as shown in FIG. 3F, an insulation layer 202 and a thermocouple word line layer 901 are sequentially deposited on the first conductivity type substrate 101. The insulation layer 202 and the thermocouple word line layer 901 cover the upper part of the protruding part of the channel layer 30 without covering above the internal cavity of the channel layer 30.

Figure 3G:
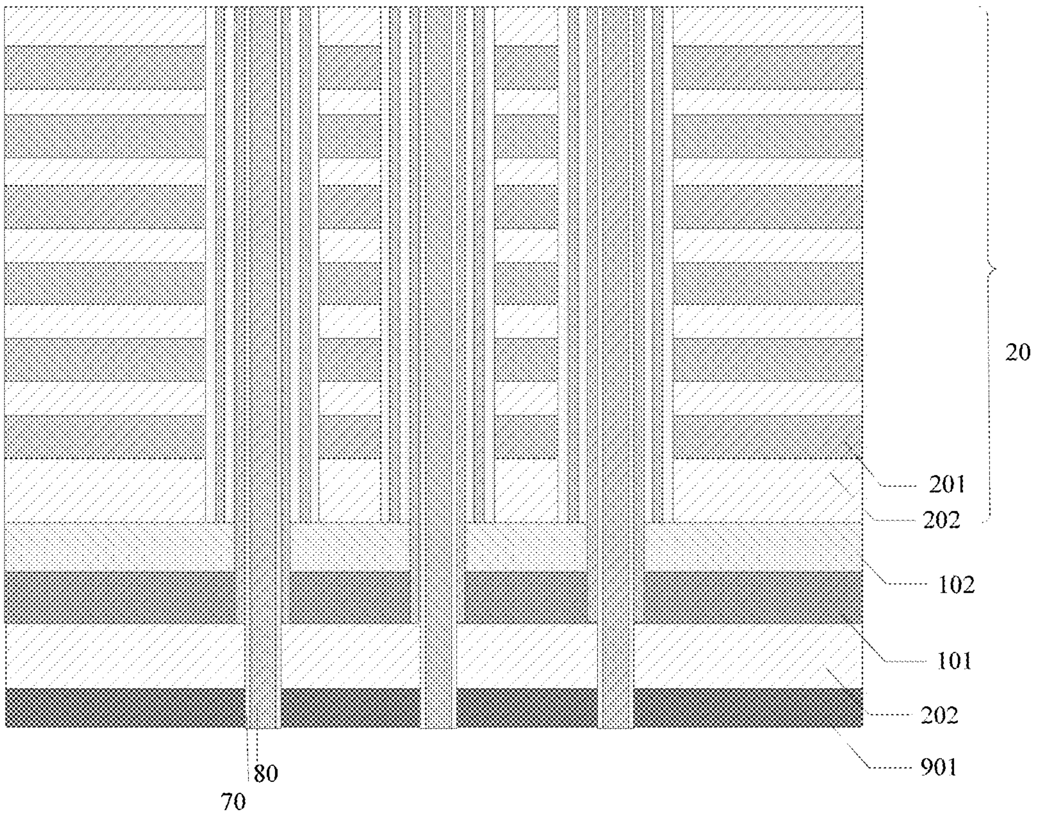

In step 307, as shown in FIG. 3G, a channel insulation layer 70 and a thermal conductive core 80 are sequentially deposited within each channel layer 30 until the channel insulation layer 70 and the thermal conductive core 80 are in the same horizontal plane as the thermocouple word line layer 901.

Figure 3H:
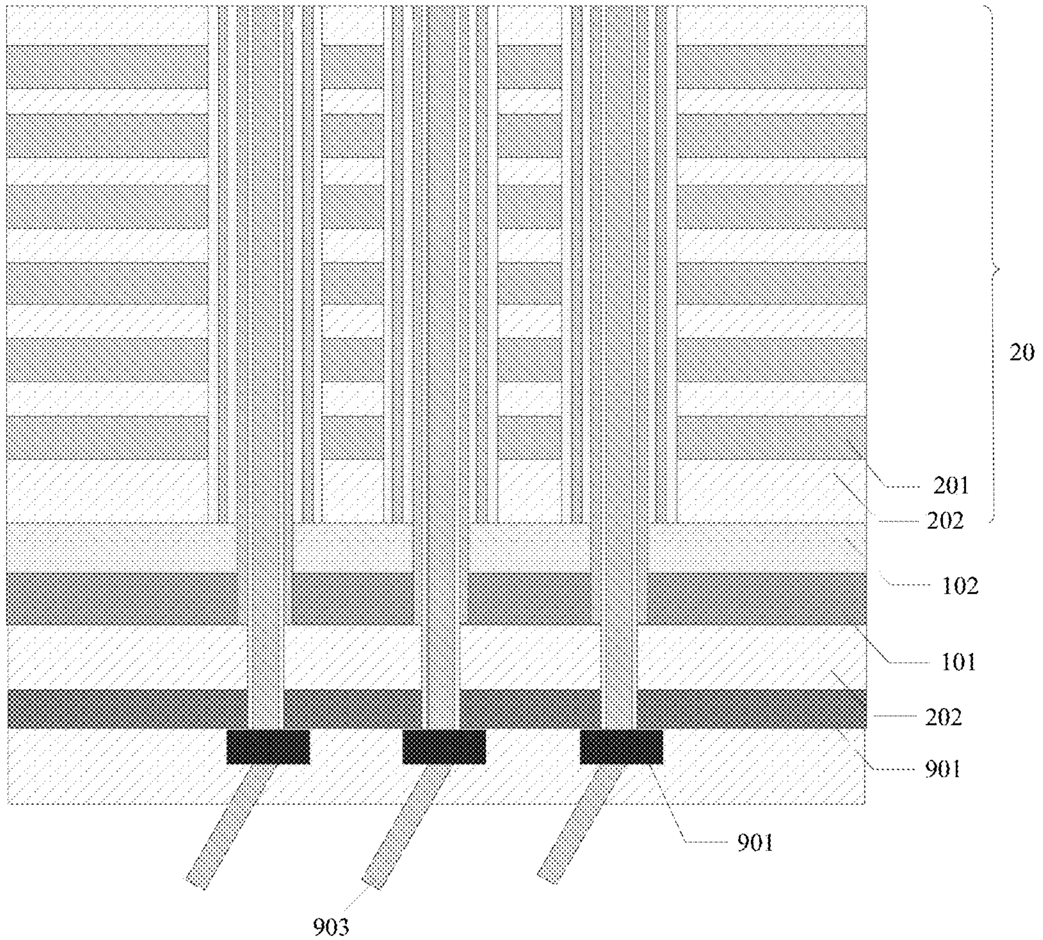

In step 308, as shown in FIG. 3H, a thermocouple layer 902 and a thermocouple word line 903 are deposited on the channel insulation layer 70 and the thermal conductive core 80, and an insulation layer is deposited on the thermocouple layer 902.

Figure 3I:
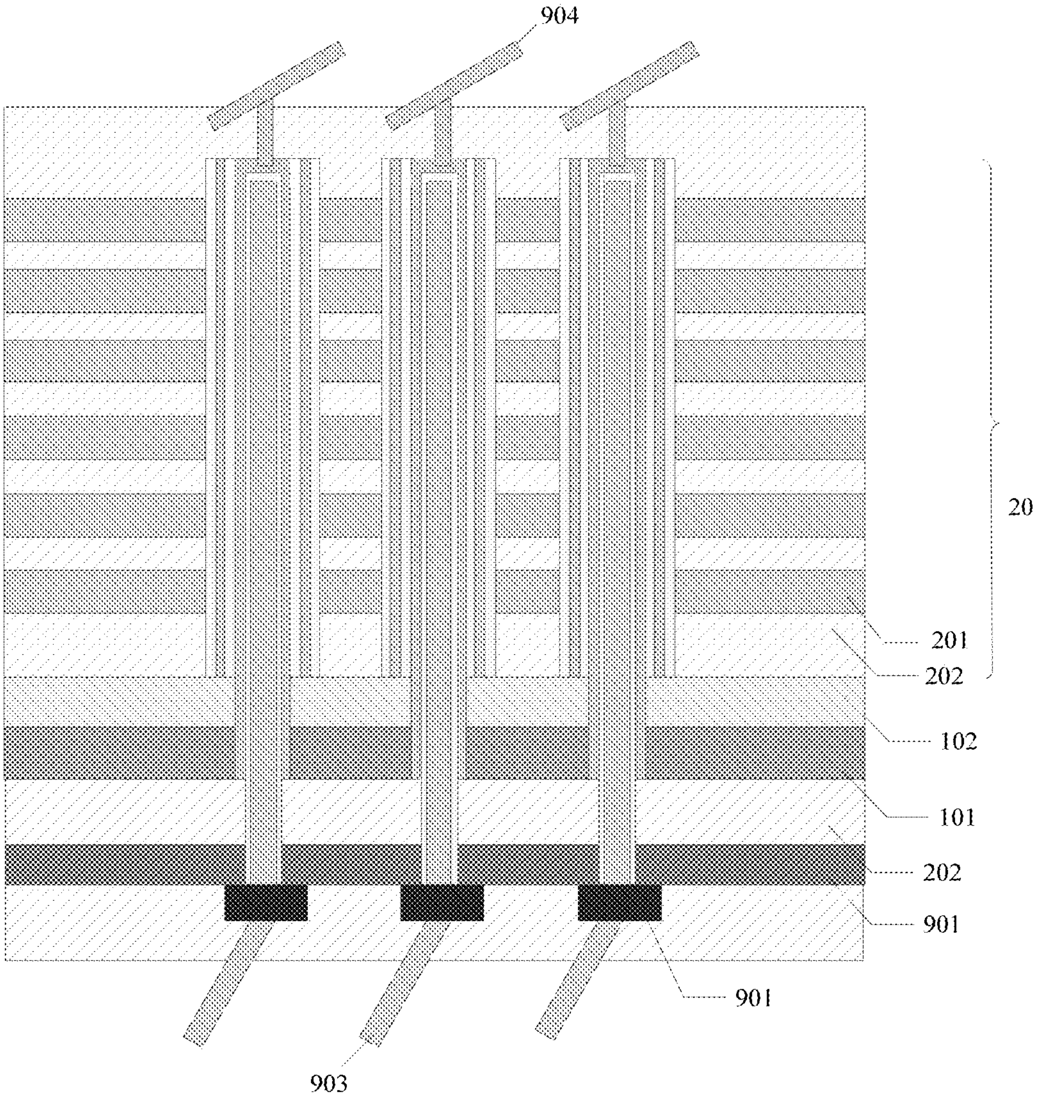

In step 309, as shown in FIG. 3I, a lead-out end of a bit line is formed, a metal is deposited, and the bit line 904 is formed, so as to complete the fabrication of the memory cell.

The schematic diagram shown in FIG. 3I and the structural schematic diagram shown in FIG. 1 are inverted. As shown in FIG. 3I, it may be understood that the process of removing some structures is not limited to the wet etching and photolithography processes described above, and may be a combination of the two or other dry etching or wet etching processes.

It should be noted that, embodiments of the above steps are only examples, illustrating the process of manufacturing the memory cell of the present disclosure based on a structure of an existing device. In the present disclosure, any manufacturing process that may form the structure and positional relationship of the various parts of the memory cell described above is within the scope of protection of the present disclosure.

A three-dimensional memory, including any memory cell described in the present disclosure, is provided in the third exemplary embodiment of the present disclosure.

In this embodiment, the three-dimensional memory further includes a logic control unit. The front of the memory cell is attached to the front of the high logic control unit. The three-dimensional memory may be a three-dimensional NAND memory.

In this embodiment, the selection of thermocouple layers may be achieved through the logic control unit. The logic control unit may select at least one thermocouple layer and heat at least one corresponding thermal conductive core, so as to raise the temperatures of the channel layer and the memory layer to the preset temperatures, achieving a good data writing and memory process.

A method of operating the three-dimensional memory described above is provided in the fourth exemplary embodiment of the present disclosure. The method includes: controlling a voltage bias of the substrate, a drain layer, a gate layer, or the thermocouple layer of at least one of memory cells in the three-dimensional memory, so that the at least one of the memory cells in the three-dimensional memory respectively achieve data writing, reading, and erasing operations.

The method includes an operation method for data reading, an operation method for data erasing, and an operation method for data writing. There is no fixed order of execution between the operation method for data reading, the operation method for data erasing, and the operation method for data writing.

Figure 4:
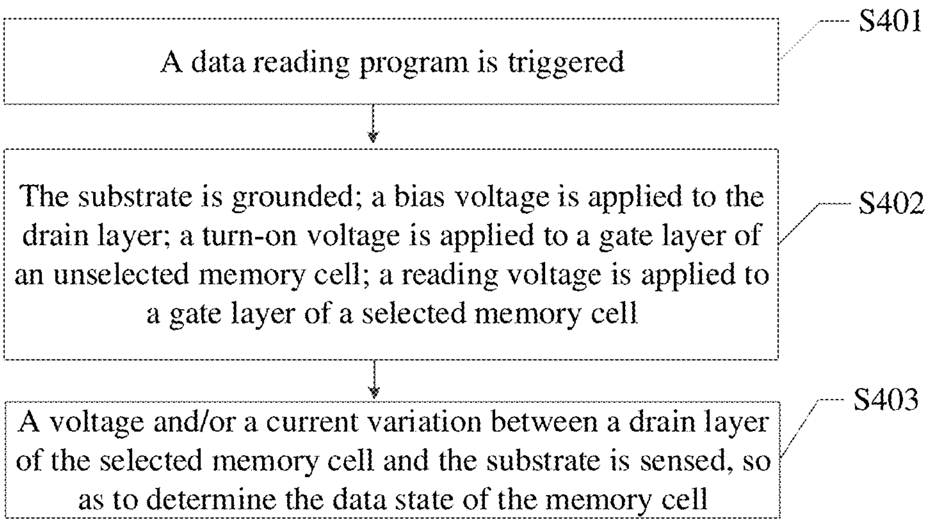
FIG. 4 schematically shows a flowchart of a data reading operation in a method of operating a three-dimensional memory according to an embodiment of the present disclosure.

As shown in FIG. 4, the operation method for data reading includes steps S401 to S403.

In step S401, a data reading program is triggered.

In step S402, a bias voltage is applied to the drain layer: the substrate is grounded: a turn-on voltage is applied to a gate layer of an unselected memory cell; and a reading voltage is applied to a gate layer of a selected memory cell.

In step S403, a voltage and/or a current variation between a drain layer of the selected memory cell and the substrate is sensed, so as to read data.

In this embodiment, when performing the data reading operation on the memory, a bias voltage is applied to the drain layer, and the substrate is grounded, so that the state of the data stored in the three-dimensional memory may be determined by sensing the current variation between the drain layer and the substrate when performing the reading operation. The range of the bias voltage is 1 V to 1.4 V, preferably 1.2 V. Under the above conditions, if the channel layer is conductive, the conduction current is inversely proportional to the threshold voltage (VT) of the memory cell. For the three-dimensional memory, the conduction of the channel layer is due to a voltage applied to the gate is greater than the VT of the memory cell.

For unselected memory cells, when performing the reading operation, a conduction voltage is applied to the gate layer to cause the channel layer to be conductive, so that the current flows from the drain layer to the substrate. The conduction voltage is a voltage that may be guaranteed to be greater than the VT of any memory cell. The conduction voltage cannot be too large, otherwise it will cause tunneling effects in the three-dimensional memory. The range of the conduction voltage may be between 2 V and 8 V.

For the selected memory cells, when performing the reading operation, a reading voltage is applied to the gate layer. If the reading voltage is greater than the VT of the memory cell, the channel layer is conductive. By applying different reading voltages to the gate layer, the amount of charge stored in the memory cell and the data stored in the memory cell may be determined.

Figure 5:
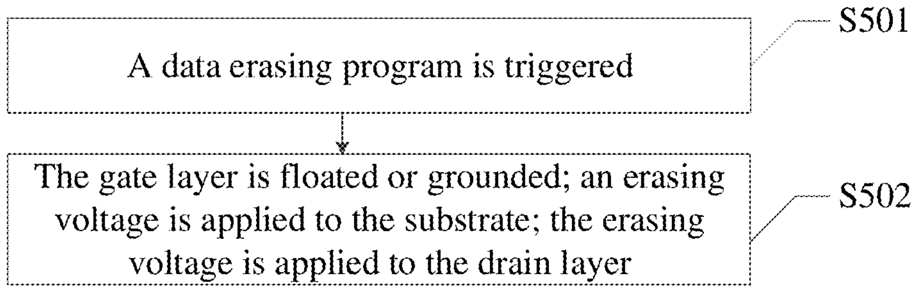
FIG. 5 schematically shows a flowchart of a data erasing operation in a method of operating a three-dimensional memory according to an embodiment of the present disclosure.

As shown in FIG. 5, the operation method for data erasing includes steps S501 to S502.

In step S501, a data erasing program is triggered.

In step S502, the gate layer is floated or grounded: an erasing voltage is applied to the substrate; and the erasing voltage is applied to the drain layer.

When performing the data erasing operation on the three-dimensional memory, the gate layer is floated or grounded, an erasing voltage is applied to the semiconductor region, and an erasing voltage is applied to the drain layer. As the drain layer is at the high potential, electrons captured in the charge capture layer may be attracted. The erasing voltage is sufficient to induce tunneling effects in the three-dimensional memory, allowing the electrons to be successfully attracted by the drain, thereby releasing electrons on the charge capture layer. The semiconductor region maintains the same potential as the drain layer to prevent electrons from flowing from the drain layer to the semiconductor region. The range of the erasing voltage is 14 V to 20 V, preferably 14 V.

Through the above erasing method, the data may be erased using the drain layer without applying a high voltage, achieving top erasure and improving the efficiency of the erasing operation of the three-dimensional memory.

Figure 6:
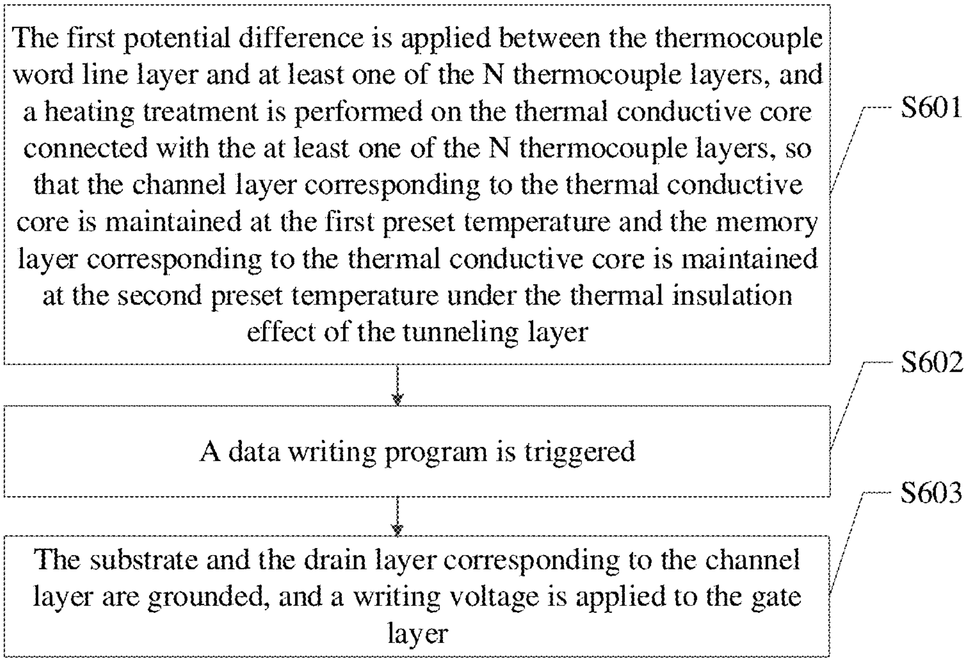
FIG. 6 schematically shows a flowchart of a data writing operation in a method of operating a three-dimensional memory according to an embodiment of the present disclosure.

As shown in FIG. 6, the operation method for data writing includes steps S601 to S603.

In step S601, the first potential difference is applied between the thermocouple word line layer and at least one of the N thermocouple layers, and a heating treatment is performed on the thermal conductive core connected with the at least one of the N thermocouple layers, so that the channel layer corresponding to the thermal conductive core is maintained at the first preset temperature and the memory layer corresponding to the thermal conductive core is maintained at the second preset temperature under the thermal insulation effect of the tunneling layer.

In step S602, a data writing program is triggered.

In step S603, the substrate and the drain layer corresponding to the channel layer are grounded, and a writing voltage is applied to the gate layer.

In this embodiment, before performing data writing on the memory, the first potential difference is applied between the thermocouple word line layer 901 and at least one of the N thermocouple layers 902, and a heating treatment is performed on the thermal conductive core 80 connected with the at least one of the N thermocouple layers 902, so that the channel layer 30 corresponding to the thermal conductive core is maintained at the first preset temperature and the memory layer 50 corresponding to the thermal conductive core is maintained at the second preset temperature under the thermal insulation effect of the tunneling layer 40, followed by triggering the data writing program. The first potential difference may be in a range of 8 V to 10 V, which may be used to raise the temperature of the channel layer 30 and the temperature of the memory layer 50 to the preset temperatures in milliseconds.

When performing the data writing operation on the three-dimensional memory, the drain layer is grounded, the substrate is grounded, and a writing voltage is applied to the gate layer. As the gate layer is at the high potential, electrons may be attracted to approach the gate layer. The writing voltage is sufficient to induce tunneling effects in the three-dimensional memory, so as to cause electrons to be captured by the charge capture layer as they approach the gate layer. The range of the writing voltage is not higher than 25 V. Different programming voltages determine the number of electrons written into the charge capture layer. Therefore, different programming voltages may be used to achieve different data states of memory cells in the three-dimensional memory. In above embodiments, electrons are attracted to the gate layer, so the current flows from the gate layer to the substrate.

In this embodiment, the operation method is not limited to these steps, and other steps that are omitted may be adjusted according to the actual situation.

In the method of operating the three-dimensional memory provided in embodiments, the drain layer may be used for data erasing without applying high voltage, while facilitating data reading and writing, thereby effectively preventing damage to the device and improving the service life of the three-dimensional memory. While ensuring a good writing temperature for the memory cell, a good data memory temperature is achieved.

It should be noted that, the manufacturing method adopted in embodiments of the present disclosure is not limited to above embodiments, but may be replaced by other mature methods in the related art, and does not constitute a limitation of embodiments of the present disclosure.

From the above description, it may be seen that the above-mentioned embodiments of the present disclosure have achieved at least the following technical effects.

(1) The memory cell provided in the present disclosure is provided with a thermal conductive core inside the channel, and an end of each thermal conductive core is connected to a thermocouple. The thermocouples may generate thermal pulses in units of a string or string group to heat the thermal conductive cores, achieving the purpose of forming a temperature gradient between the channel layer, the memory layer, and the block layer. Such memory cell may achieve good data memory while ensuring good writing performance.

(2) A better data writing environment may be achieved by reading the ambient temperature before the thermocouple operation and adjusting the number of pulses generated by the thermocouples according to the ambient temperature.

(3) The writing operation time length of the three-dimensional memory provided in the present disclosure does not exceed 3 ms.

Although the present disclosure has been illustrated and described in detail in the accompanying drawings and the above descriptions, such illustrations and descriptions should be considered illustrative or exemplary, rather than restrictive.

Those skilled in the art may understand that the features recorded in the various embodiments and/or claims of the present disclosure may be combined in multiple scopes, even if such combinations are not explicitly recorded in the present disclosure. Specifically, without departing from the spirit and teachings of the present disclosure, the features recorded in the various embodiments and/or claims of the present disclosure may be combined in multiple ways. All these combinations fall within the scope of the present disclosure.

Although the present disclosure has been illustrated and described with reference to specific exemplary embodiments of the present disclosure, those skilled in the art should understand that various changes in form and details may be made to the present disclosure without departing from the spirit and scope of the present disclosure defined by the accompanying claims and their equivalents. Therefore, the scope of the present disclosure should not be limited to the aforementioned embodiments, but should be determined not only by the accompanying claims, but also by their equivalents.

What is claimed is:

1. A memory cell, comprising:

an array of channel layers comprising N channel layers, wherein the N channel layers are vertically provided on a substrate in a first direction, a tunneling layer and a memory layer are sequentially provided on an outer side of the N channel layers, and N is a positive integer;

N thermal conductive cores located in the N channel layers respectively and penetrating the substrate; and an array of thermocouples comprising a thermocouple word line layer grown on the substrate in a negative direction of the first direction and N thermocouple layers located on the thermocouple word line layer, wherein the N thermocouple layers are connected one-to-one with the N thermal conductive cores, wherein a first potential difference is applied between the thermocouple word line layer and at least one of the N thermocouple layers, and the thermal conductive core connected with the at least one of the N thermocouple layers is heated, so that the channel layer corresponding to the thermal conductive core is maintained at a first preset temperature and the memory layer corresponding to the thermal conductive core is maintained at a second preset temperature under a thermal insulation effect of the tunneling layer.

2. The memory cell according to claim 1, wherein the memory cell is configured to: apply a writing voltage to a gate layer of the memory cell, after a temperature of at least one channel layer in the array of the channel layers is maintained at the first preset temperature and a temperature of the memory layer corresponding to the at least one channel layer is maintained at the second preset temperature, and wherein a drain layer and the substrate are grounded, and the memory cell is driven to perform a writing operation by using the writing voltage.

3. The memory cell according to claim 1, wherein a heating time length for the first potential difference is negatively correlated with a thermal conductive performance of the N thermal conductive cores.

4. The memory cell according to claim 1, wherein each of the N thermal conductive cores comprises at least one of tungsten, gold, copper, or silicon carbide.

5. The memory cell according to claim 1, further comprising a channel insulation layer provided between the channel layer and the thermal conductive core.

6. The memory cell according to claim 5, wherein the channel insulation layer is configured to isolate the channel layer and the thermal conductive core, and the channel insulation layer comprises silicon oxide or aluminum oxide.

7. The memory cell according to claim 1, wherein the tunneling layer comprises silicon oxide or silicon nitride.

8. The memory cell according to claim 1, further comprising a block layer provided on an outer side of the memory layer.

9. A three-dimensional memory comprising the memory cell according to claim 1.

10. A method of operating the three-dimensional memory of claim 9, comprising:

controlling a voltage bias of a substrate, a drain layer, a gate layer, or the thermocouple layer of at least one memory cell in the three-dimensional memory, so as to implement a data writing operation, a data reading operation, and a data erasing operation of the at least one memory cell in the three-dimensional memory.

11. The method according to claim 10, wherein implementing the data writing operation of the at least one memory cell in the three-dimensional memory comprises:

applying the first potential difference between the thermocouple word line layer and the at least one of the N thermocouple layers, and performing a heating treatment on the thermal conductive core connected with the at least one of the N thermocouple layers, so that the channel layer corresponding to the thermal conductive core is maintained at the first preset temperature and the memory layer corresponding to the thermal conductive core is maintained at the second preset temperature under the thermal insulation effect of the tunneling layer;

triggering a data writing program; and grounding the substrate and the drain layer corresponding to the channel layer, and applying a writing voltage to the gate layer, wherein the at least one memory cell in the three-dimensional memory is driven to perform the writing operation by using the writing voltage.

12. The method according to claim 10, wherein implementing the data reading operation of the at least one memory cell in the three-dimensional memory comprises:

triggering a data reading program;

applying a bias voltage to the drain layer of the three-dimensional memory;

grounding the substrate;

applying a turn-on voltage to a gate layer of an unselected memory cell, and applying a reading voltage to a gate layer of a selected memory cell; and sensing a voltage and/or a current variation between a drain layer of the selected memory cell and the substrate, so as to read data.

13. The method according to claim 10, wherein implementing the data erasing operation of the at least one memory cell in the three-dimensional memory comprises:

triggering a data erasing program;

floating or grounding the gate layer; and applying an erasing voltage to the drain layer, wherein the erasing voltage is sufficient to induce a tunneling effect in the three-dimensional memory, so that electrons stored in the three-dimensional memory are attracted to the drain layer.

* * * * *